(12) United States Patent
Majumdar et al.

(10) Patent No.: US 9,041,061 B2
(45) Date of Patent: May 26, 2015

(54) III-V DEVICE WITH OVERLAPPED EXTENSION REGIONS USING REPLACEMENT GATE

(71) Applicant: International Business Machines Corporation, Armonk, NY (US)

(72) Inventors: Amlan Majumdar, White Plains, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/950,788

(22) Filed: Jul. 25, 2013

(65) Prior Publication Data

US 2015/0028388 A1 Jan. 29, 2015

(51) Int. Cl.
*H01L 29/66* (2006.01)
*H01L 29/78* (2006.01)

(52) U.S. Cl.
CPC .......... *H01L 29/78* (2013.01); *H01L 29/66431* (2013.01)

(58) Field of Classification Search
CPC ............................. H01L 27/085; H01L 29/78
USPC ........................................................ 257/192
See application file for complete search history.

(56) References Cited

U.S. PATENT DOCUMENTS

| | | | |
|---|---|---|---|
| 6,180,978 B1 * | 1/2001 | Chatterjee et al. | 257/327 |
| 6,699,793 B2 | 3/2004 | Lee | |
| 7,892,910 B2 | 2/2011 | Feilchenfeld et al. | |
| 7,964,896 B2 | 6/2011 | Kiewra et al. | |
| 8,178,400 B2 | 5/2012 | Chang et al. | |
| 8,361,889 B2 | 1/2013 | Adam et al. | |
| 2002/0072185 A1 | 6/2002 | Chen | |
| 2007/0170500 A1 | 7/2007 | Liu et al. | |
| 2008/0258225 A1 | 10/2008 | Yang et al. | |
| 2008/0296622 A1 * | 12/2008 | Kiewra et al. | 257/194 |
| 2010/0102358 A1 * | 4/2010 | Lanzieri et al. | 257/194 |
| 2011/0147713 A1 * | 6/2011 | Pillarisetty et al. | 257/24 |

OTHER PUBLICATIONS

IOP Science, Hemant Pardeshi et al., "Effect of underlap and gate length on device performance of an AlInN/GaN underlap MOSFET", Journal of Semiconductors, vol. 33, No. 22, Dec. 2012, pp. 124001-1-124001-7.

* cited by examiner

*Primary Examiner* — Ajay K Arora
(74) *Attorney, Agent, or Firm* — Steven M. Kellner; Louis J. Percello

(57) ABSTRACT

A structure and method for fabricating a III-V compound semiconductor-containing heterostructure field-effect transistor (FET) with self-aligned and overlapped extensions using a replacement gate process is disclosed. The a III-V compound semiconductor-containing heterostructure field-effect transistor (FET) structure may be formed by forming a III-V compound semiconductor-containing heterostructure having multiple layers and a T-shaped gate structure using a gate replacement process. The T-shaped gate structure may be formed with a bottom surface substantially below an upper surface of the III-V compound semiconductor-containing heterostructure and an upper surface above the III-V compound semiconductor-containing heterostructure. An undoped region may be formed below the bottom surface of the T-shaped gate structure on a layer of the III-V compound semiconductor-containing heterostructure.

9 Claims, 10 Drawing Sheets

III-V DEVICE WITH OVERLAPPED EXTENSION REGIONS USING REPLACEMENT GATE

FIELD

The present invention relates generally to the fabrication of integrated circuits, and more particularly, to a structure and method for fabricating a III-V compound semiconductor-containing heterostructure field-effect transistor (FET) with self-aligned and overlapped extensions using a replacement gate process.

BACKGROUND

Compound III-V semiconductors are receiving renewed attention for use as channel materials for advanced ultra large scale integration (ULSI) digital logic applications due to their high electron mobility. For example, the InGaAs/InAlAs material system is one of the most promising material systems for this application due to its large conduction-band offsets and high carrier mobility. Schottky-gated InGaAs high electron mobility transistors (HEMTs) grown on InP substrates have produced maximum transconductance $g_m$ values and have been shown to compare favorably in terms of a power-delay product.

Conventional III-V HEMTs are self-aligned structures in which the physical length of the gate structure equals the effective length of the channel. However, in III-V HEMTs, gate leakage due to a lack of gate dielectric is an important factor limiting their performance reliability. Thus, a thin gate dielectric layer is often inserted between the gate metal and the wide bandgap barrier layer forming a III-V metal-oxide semiconductor HEMT (III-V MOS-HEMT) or a III-V metal-oxide semiconductor field-effect transistor (III-V MOSFET). The use of a gate dielectric layer has the beneficial effect of reducing gate leakage. III-V MOS-HEMTs and III-V MOS-FETs devices exhibit a leakage reduction of six to ten orders of magnitude compared to a Schottky barrier HEMT of similar design. However, the use of a gate dielectric has the deleterious effect of reducing the transconductance because of a larger gate-to-channel separation. Furthermore, decrease of gate-to-source capacitance may cause a shift of threshold voltage (Vt) for devices with a doped channel.

One limitation with conventional self-aligned III-V MOS-HEMTs and III-V MOSFETs is that they are typically underlapped (i.e., the effective length of the channel is larger than the physical length of the gate structure) due to the fact that ion implantation techniques used in conventional silicon-based MOSFETs to create overlapped devices are not viable for III-V materials. In III-V devices, damage created from ion implantation and subsequent rapid thermal anneal (RTA) can lead to strain relaxation, which degrades the transport properties of III-V materials. Conventional methods to manage the problem of strain relaxation have involved keeping the RTA temperature low, but this leads to an insufficient diffusion and insufficient activation of implanted ions.

Accordingly, it may be desirable to overcome the deficiencies and limitations described hereinabove.

SUMMARY

According to one embodiment of the present invention, a method of forming a semiconductor device is disclosed. The method may involve forming of a III-V compound semiconductor-containing heterostructure having at least one layer and a T-shaped gate structure using a gate replacement process. The T-shaped gate structure may be formed with a bottom surface substantially below an upper surface of the III-V compound semiconductor-containing heterostructure and an upper surface above the III-V compound semiconductor-containing heterostructure. An undoped region may be formed below the bottom surface of the T-shaped gate structure on a layer of the III-V compound semiconductor-containing heterostructure.

In another embodiment, a method of forming a semiconductor device is disclosed. The method of forming the semiconductor device may include: forming a III-V compound semiconductor-containing heterostructure having at least one layer; forming a T-shaped gate structure, having a bottom surface substantially below an upper surface of the III-V compound semiconductor-containing heterostructure and an upper surface above the III-V compound semiconductor-containing heterostructure, using a gate replacement process; forming gate spacers, having an outer side that is substantially flush with an outer side of the T-shaped gate structure, on the upper surface of the III-V compound semiconductor-containing heterostructure adjacent to and contacting a vertical portion of the T-shaped gate structure; forming raised source-drain (RSD) regions on the upper surface of the III-V compound semiconductor-containing heterostructure adjacent to and contacting the gate spacers; and forming dielectric regions on an upper surface of the RSD regions, the dielectric regions contacting the gate spacers and contacting the outer side of the T-shaped gate structure and having an upper surface that is substantially flush with the upper surface of the T-shaped gate structure. An undoped region may be formed below the bottom surface of the T-shaped gate structure on a layer of the III-V compound semiconductor-containing heterostructure.

In another embodiment, a structure of a semiconductor device is disclosed. The semiconductor structure may include a III-V compound semiconductor-containing heterostructure having at least one layer; a T-shaped gate structure having a bottom surface on a channel layer substantially below an upper surface of the III-V compound semiconductor-containing heterostructure and an upper surface above the III-V compound semiconductor-containing heterostructure; gate spacers, having an outer side that is substantially flush with an outer side of the T-shaped gate structure, on the upper surface of the III-V compound semiconductor-containing heterostructure adjacent to and contacting a vertical portion of the T-shaped gate structure; and raised source-drain (RSD) regions on the upper surface of the III-V compound semiconductor-containing heterostructure adjacent to and contacting the gate spacers. The structure may include dielectric regions on an upper surface of the RSD regions contacting the gate spacers the outer side of the T-shaped gate structure. The dielectric regions may have an upper surface that is substantially flush with the upper surface of the T-shaped gate structure. The structure may also include an undoped region below the bottom surface of the T-shaped gate structure on the channel layer of the III-V compound semiconductor-containing heterostructure.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Two embodiments by which to achieve self-aligned overlapped extensions in a III-V compound semiconductor-containing heterostructure FETs are described in detail below by referring to the accompanying drawings FIGS. 1-8B. Process steps and structures common to both embodiments are described in detail by FIGS. 1-6, while one embodiment is described in detail by FIGS. 7A-7B and another is described in detail by FIGS. 8A-8B.

In the present invention, the term "III-V compound semiconductor" denotes a semiconductor material that includes at least one element from Group III of the Periodic Table of Elements and at least one element from Group V of the Periodic Table of Elements. Typically, each of the III-V compound semiconductor layers is a binary, ternary, or quaternary III-V containing compound. Examples of III-V compound semiconductors that can be used in the present invention include, but are not limited to, alloys of InGaAs, InAlAs, InAlAsSb, InAlAsP, and InGaAsP.

Figure 1:
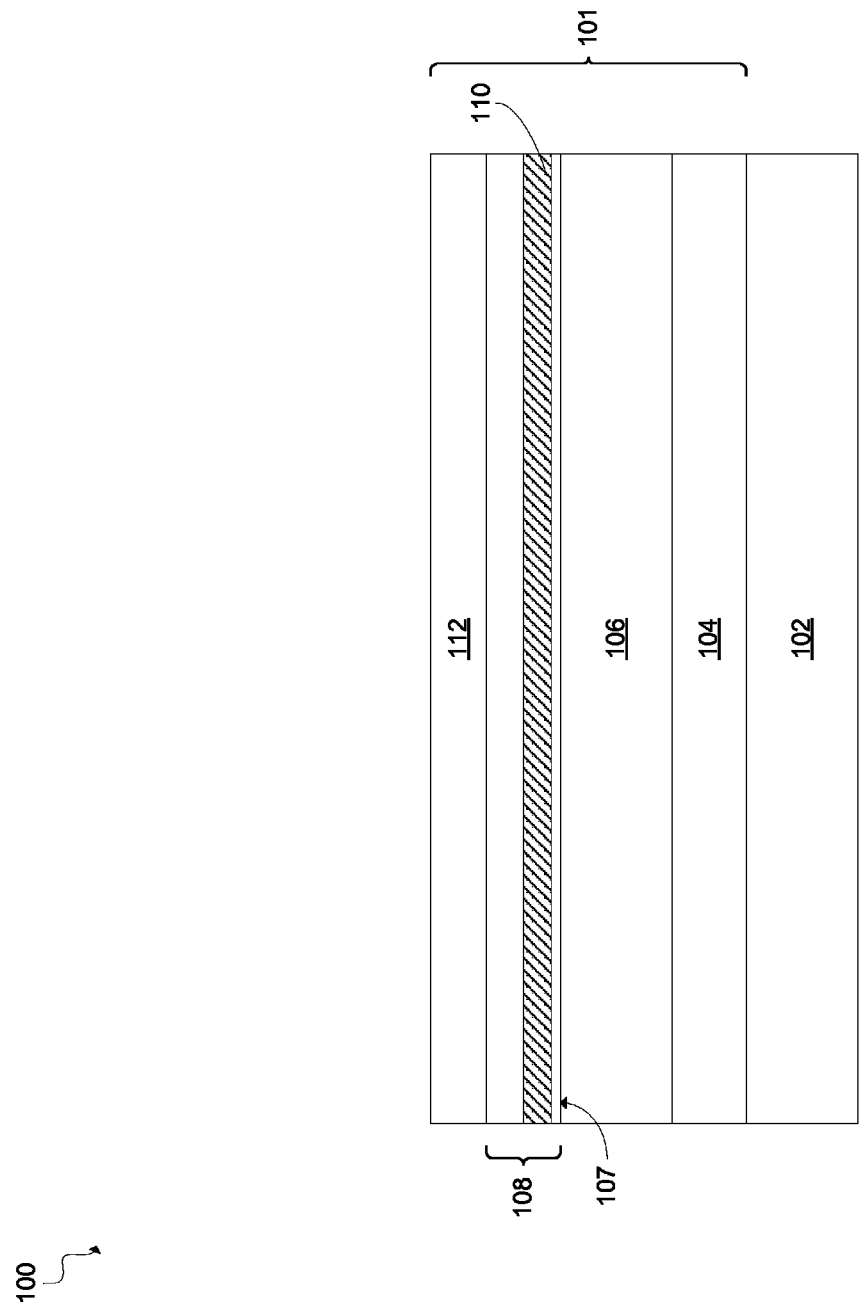
FIG. 1 is a cross sectional view of a III-V compound semiconductor-containing heterostructure formed on a semiconductor substrate, according to an embodiment of the present invention.

Referring to FIG. 1, an initial structure 100 may be used in one embodiment of the present invention. Structure 100 may include a III-V compound semiconductor-containing heterostructure 101 formed on top of a semiconductor substrate 102. The III-V compound semiconductor-containing heterostructure 101 may include a III-V compound semiconductor buffer layer 104 having a first bandgap, a III-V compound semiconductor channel layer 106 having a second bandgap located on a upper surface of the buffer layer 104, a III-V compound semiconductor barrier layer 108 having a third bandgap located on an upper surface of the channel layer 106, and an etch stop layer 112 on an upper surface of the barrier layer 108.

In the present embodiment, the barrier layer 108 may include a delta doped region 110 that is located in a lower region of the barrier layer 108 abutting next to, but not in direct contact with, the interface with the underlying channel layer 106. The dopant atom present in the delta doped region 110 may be an n-type dopant (i.e., an element from Group IV or VI of the Periodic Table of Elements) or a p-type dopant (i.e., an element from Group II or IV of the Periodic Table of Elements). The concentration of dopant in the delta doped region 110 may be approximately $10^{11}$ atom/cm$^2$ to approximately $10^{13}$ atom/cm$^2$.

The semiconductor substrate 102 may include any semiconductor material including, for example, Si, SiGe, SiGeC, SiC, Ge alloys, Ga, GaAs, InAs, InP, Ge, and all other III-V compound semiconductors. The semiconductor substrate 102 may be composed of a layered semiconductor material such as, for example, a semiconductor-on-insulator substrate. The semiconductor substrate 102 may be doped, undoped, or contain doped and undoped regions therein. The semiconductor substrate 102 may have a single crystal orientation or it may have surface regions that have different crystal orientation. The semiconductor substrate 102 may be strained, unstrained, or a combination thereof.

The bandgap of the barrier layer 108 (i.e., the third bandgap) may be larger (wider) than the bandgap of the channel layer 106 (i.e., the second bandgap). As stated above, the term "bandgap" refers to the energy difference between the top of the valance band (i.e., $E_v$) and the bottom of the conduction band (i.e., $E_c$). The barrier layer 108 may be composed of a III-V compound semiconductor having a bandgap value that is from approximately 0.5 times to approximately 10 times larger than the bandgap of the III-V compound semiconductor material used in the channel layer 106. In a preferred embodiment, the barrier layer 108 may be composed of a III-V compound semiconductor having a bandgap value that is from approximately 1 times to approximately 5 times larger than the bandgap of the III-V compound semiconductor material used in the channel layer 106.

The bandgap of the buffer layer 104 (i.e., the first bandgap) may also be larger than that of the channel layer 106. This helps confine the electrons within the channel layer 106. The buffer layer 104 may be composed of a III-V compound semiconductor having a bandgap value that is from approximately 0.5 times to approximately 10 times larger than the bandgap of the III-V semiconductor material used in the channel layer 106. In one embodiment, the buffer layer 104 may be composed of a III-V compound semiconductor having a bandgap value that is from approximately 1 times to approximately 5 times larger than the bandgap of the III-V semiconductor material used in the channel layer 106.

It is noted that the bandgap of the buffer layer 104 and the bandgap of the barrier layer 108, which are larger than the bandgap of the channel layer 106, do not necessarily have the same value. Since wide bandgap materials are used for the barrier layer 108 and buffer layer 104, and a narrow bandgap material is used for the channel layer 106, carriers are confined to the channel layer 106 under certain gate bias range. The carriers may be confined in the channel layer 106 when typical gate bias conditions are applied.

In one embodiment of the present invention, the barrier layer 108 and the buffer layer 104 may be composed of an alloy of InAlAs, while the channel layer 106 may be composed of an alloy of InGaAs. By "alloy of InAlAs" it is meant a composition of $In_xAl_{1-x}As$ wherein x is from approximately 0 to approximately 1, and more preferably from approximately 0.4 to approximately 0.6. By "alloy of InGaAs" it is meant a composition of $In_yGa_{1-y}As$ wherein y is from approximately 0 to approximately 1, and more preferably from approximately 0.3 to approximately 0.8. It is noted that each of the III-V compound semiconductor layers employed in the present invention may be a single crystal material of typical commercial quality. The typical commercial quality of the III-V compound semiconductor layers is a result of utilizing an epitaxial growth process such as, for example, molecular beam epitaxy (MBE) or metal-organic chemical vapor deposition (MOCVD). The III-V compound semiconductor layers may be epitaxially grown utilizing III/V-containing precursors that are well known to those skilled in the art. In some embodiments, a graded III-V compound semiconductor layer can be formed.

When a delta doped region 110 is formed into the lower region of the barrier layer 108, an in-situ doping deposition process may be used in which the dopant atom is introduced during the initial formation of the barrier layer 108 and following the formation of a desired thickness of the delta doped region 110 (approximately 0.1 nm to approximately 2.0 nm), the dopant is removed from the precursor stream and the barrier layer 108 formation continues. Alternatively, the delta doped region 110 may be formed utilizing ion implantation after the barrier layer 108 has been formed. The conditions of such an implant are selected to provide a delta doped region next to, but not in contact with, the interface 107 of the underlying channel layer 106.

Each of the individual III-V compound semiconductor layers shown in FIG. 1 are thin (providing a total thickness of less than approximately 600 nm). The buffer layer 104 may have a thickness of approximately 5 nm to approximately 500 nm. The channel layer 106 may have a thickness of approximately 2 nm to approximately 10 nm. The barrier layer 108 may have a thickness of approximately 1 nm to approximately 5 nm. The etch stop layer 112 may have a thickness of approximately 1 nm to approximately 2 nm.

Figure 2:
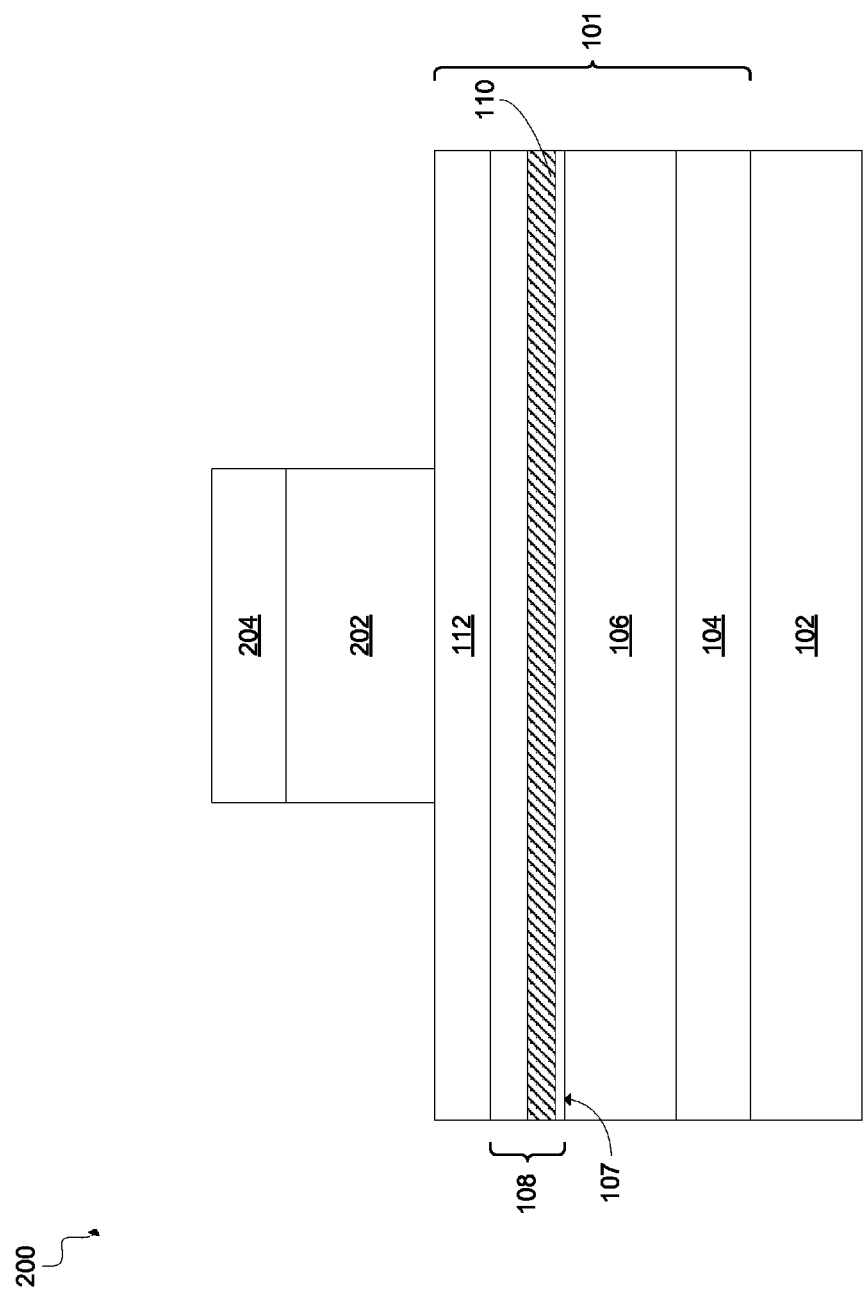
FIG. 2 is a cross sectional view illustrating the formation of a dummy gate and dummy gate hardmask, according to an embodiment of the present invention.

Referring now to FIG. 2, structure 200 is illustrative of a dummy gate 202 and dummy gate hardmask 204 patterned and formed on the III-V compound semiconductor-containing heterostructure 101. The dummy gate 202 and the dummy gate hardmask 204 may be formed by blanket deposition of a dummy gate layer (not shown) over the etch stop layer 112 and a subsequent blanket deposition of a hardmask layer over the dummy gate layer (not shown). Standard deposition techniques may be implemented to deposit the dummy gate layer (not shown) such as, but not limited to, chemical vapor deposition (CVD), plasma enhanced CVD (PECVD), physical vapor deposition (PVD), MOCVD, atomic layer deposition (ALD), evaporation, reactive sputtering, chemical solution deposition, or any other suitable deposition process.

Subsequently, the hardmask layer (not shown) and dummy gate layer (not shown) may be patterned and etched to form the dummy gate 202 and dummy gate hardmask 204. In one embodiment, standard masking and photolithography techniques may be implemented to pattern the dummy gate 202 and the dummy gate hardmask 204. In addition, standard etching techniques, such as, reactive ion etching (RIE), may then be implemented to etch the dummy gate 202 and the dummy gate hardmask 204 pattern. The dummy gate 202 may be composed of poly-silicon, an oxide, or a nitride. The dummy gate hardmask 204 may be composed of a nitride, such as, for example SiN.

Figure 3:
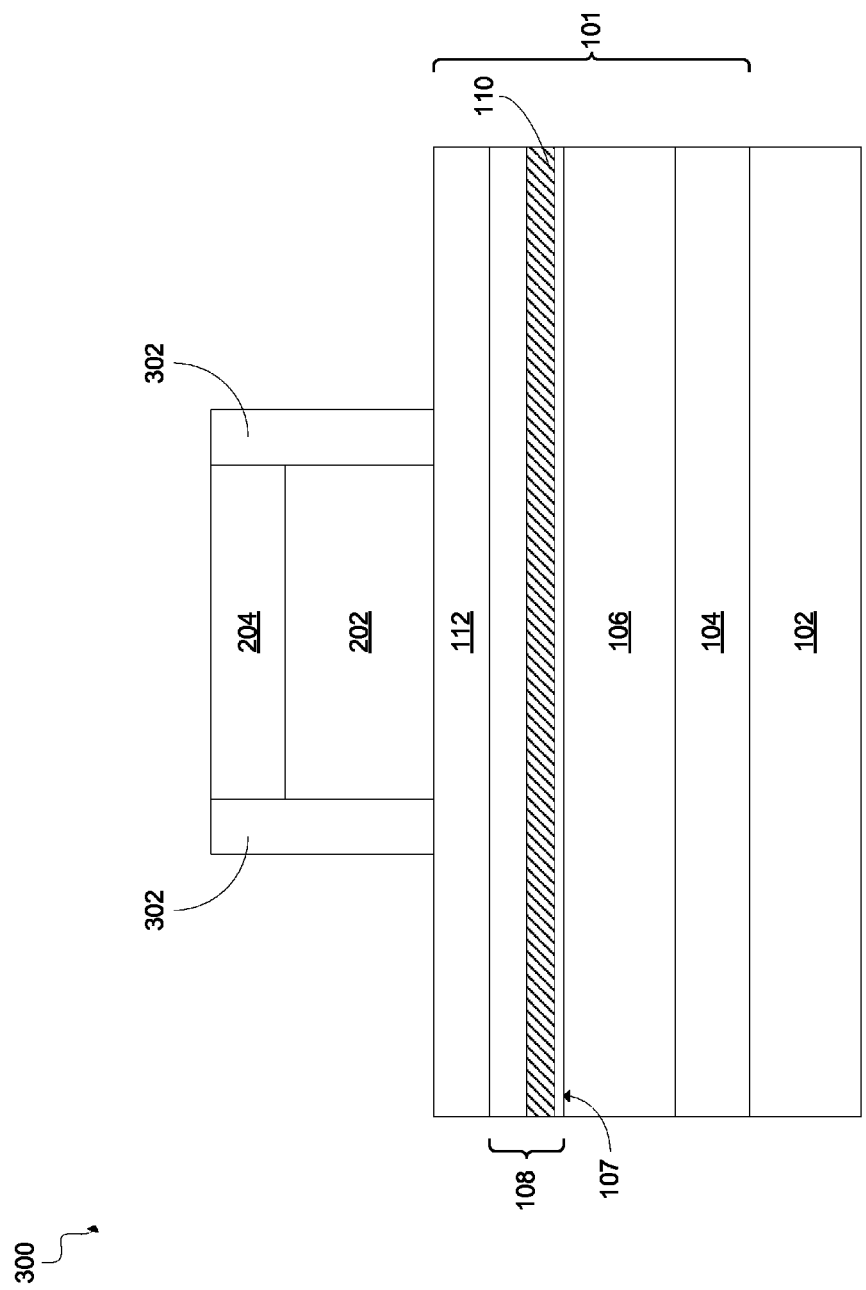
FIG. 3 is a cross sectional view illustrating the formation of sidewall spacers on the vertical sides of the dummy gate and dummy hardmask, according to an embodiment of the present invention.

Referring now to FIG. 3, a structure 300 shows a pair of sidewall spacers 302 (hereinafter "sidewall spacers") formed on the vertical sidewalls of the dummy gate 202 and dummy gate hardmask 204. The sidewall spacers 302 may be composed of the same material at the dummy gate hardmask 204. In a preferred embodiment, the sidewall spacers 302 may be composed of a nitride. The sidewall spacers 302 may be formed by depositing a conformal layer of nitride, or by bulk deposition, on the etch stop layer 112, dummy gate 202 and dummy gate hardmask 204 by standard deposition techniques such as, but not limited to, CVD, PECVD, PVD, MOCVD, ALD, low pressure CVD (LPCVD), evaporation, reactive sputtering, chemical solution deposition, or any other suitable deposition process. Subsequently, an anisotropic etch, such as RIE, may be performed to removed the deposited layer from horizontal surfaces of the etch stop layer 112 and dummy gate hardmask 204 to form the sidewall spacers 302 on the vertical sidewalls of the dummy gate 202 and the dummy gate hardmask 204.

Figure 4:
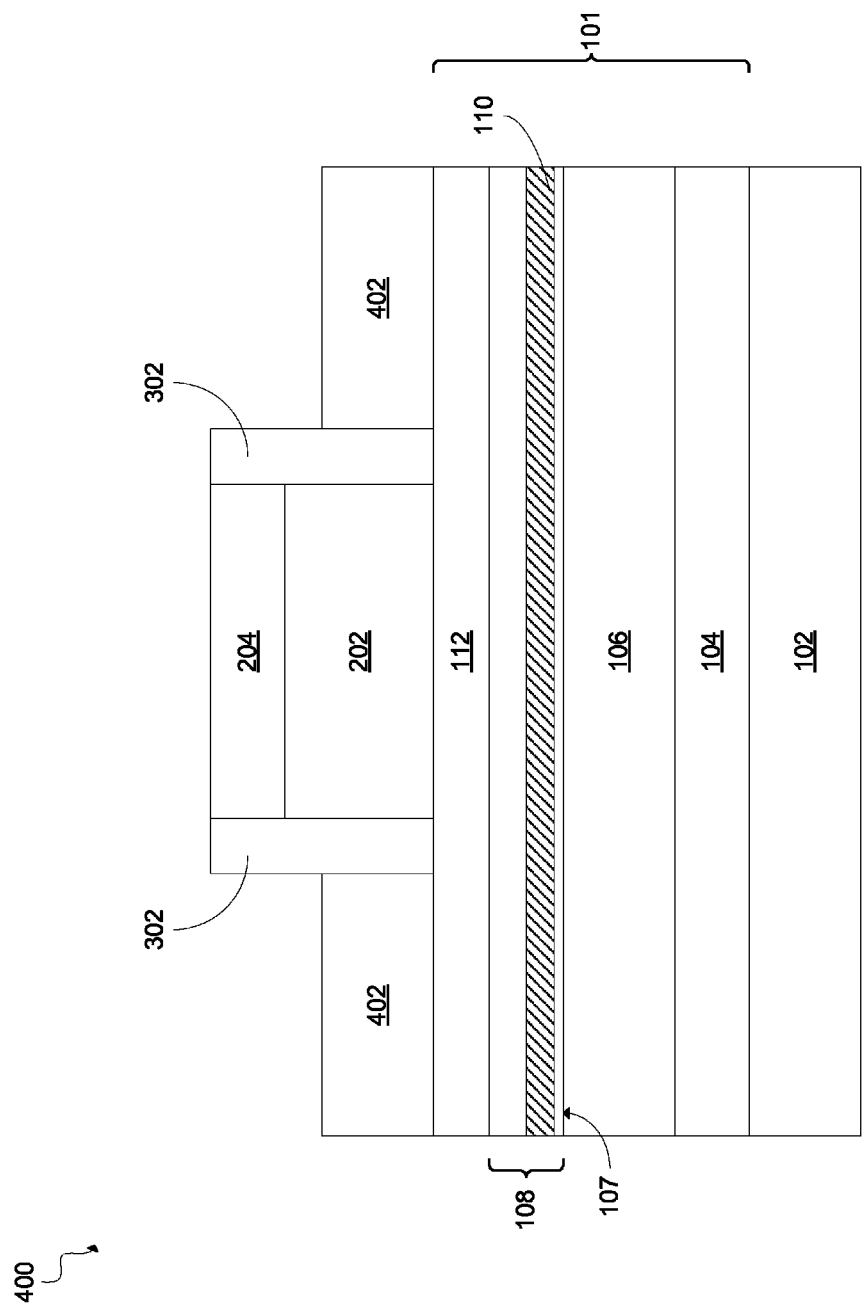
FIG. 4 is a cross sectional view illustrating the formation of raised source-drain (RSD) regions, according to an embodiment of the present invention.

Referring now to FIG. 4, a structure 400 shows raised source-drain (RSD) regions 402 formed on the etch stop layer 112 adjacent to and contacting the vertical sides of the sidewall spacers 302. The RSD regions 402 may be formed by an epitaxial growth process that is selective to the etch stop layer 112 (i.e., does not result in epitaxial growth on the dummy gate hardmask 204 and the sidewall spacers 302). As used herein, the terms "epitaxially formed," "epitaxial growth," and/or "epitaxial deposition" mean the growth of a crystalline semiconductor material on a deposition surface. During the epitaxial growth process, chemical reactants are controlled and system parameters are set so that depositing atoms arrive at the deposition surface with sufficient energy to move around on the surface and orient themselves to the crystal arrangement of the atoms of the deposition surface. In one embodiment, the RSD regions 402 may be formed by the epitaxial growth of a III-V compound semiconductor. The RSD regions 402 may also be formed by the epitaxial growth of silicon or germanium. In another embodiment, the RSD regions 402 may be composed of SiGe. The RSD regions 402 may have a thickness of approximately 5 nm to approximately 30 nm.

In one embodiment, at least one of the RSD regions 402 may be in-situ doped with a p-type dopant during the selective epitaxial growth process. P-type semiconductor devices (PFETs) in III-V materials are typically produced by doping the source-drain regions with a p-type dopant composed of elements from: group II of the Periodic Table of Elements, including beryllium or magnesium, that replace a group III atom; or group IV of the Periodic Table of Elements, including carbon, that replace a group V atom. In one embodiment, at least one of the RSD regions 402 may have a p-type dopant in a concentration ranging from approximately $1\times10^{19}$ atoms/cm$^3$ to approximately $5\times10^{21}$ atoms/cm$^3$. In another embodiment, the p-type conductivity dopant may be introduced to at least one of the RSD regions 402 using ion implantation following the epitaxial growth process that is used to form the RSD regions 402.

In one embodiment, at least one of the RSD regions 402 may be in-situ doped with an n-type dopant during the selective epitaxial growth process. N-type semiconductor devices (NFETs) in III-V materials are typically produced by doping the source-drain regions with a dopant composed of elements from: group IV of the Periodic Table of Elements, including silicon or germanium, that replace a group III atom; or (ii) group VI of the Periodic Table of Elements, including sulfur, selenium, or tellurium, that replace a group V atom. In one embodiment, at least one of the RSD regions 402 may have a n-type dopant in a concentration ranging from approximately $1\times10^{19}$ atoms/cm$^3$ to approximately $5\times10^{21}$ atoms/cm$^3$. In another embodiment, the n-type conductivity dopant may be introduced to at least one of the RSD regions 402 using ion implantation following the epitaxial growth process that is used to form the RSD regions 402.

Figure 5:
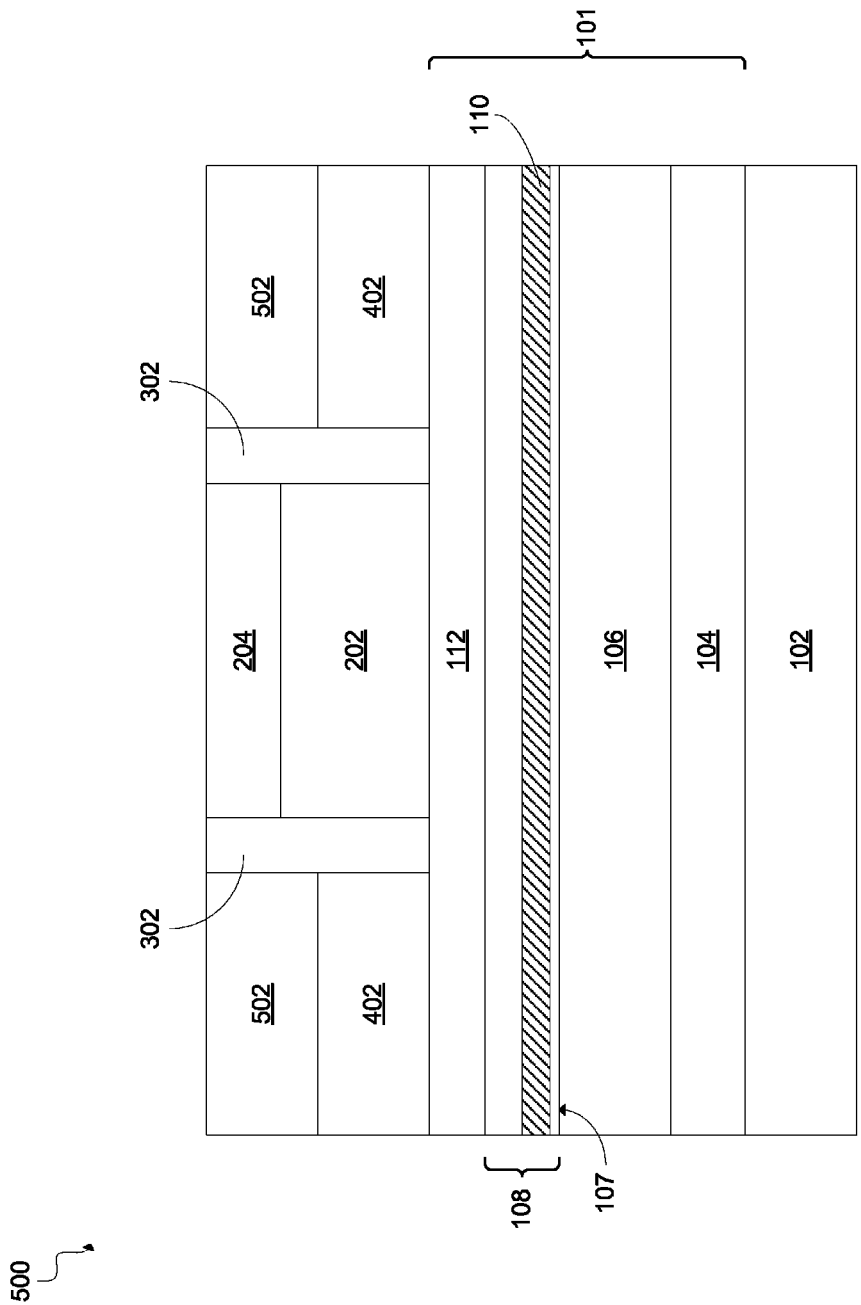
FIG. 5 is a cross sectional view illustrating the formation of dielectric regions on the RSD regions, according to an embodiment of the present invention.

Referring now to FIG. 5, a structure 500 shows a pair of dielectric regions 502 (hereinafter "dielectric regions") formed on an upper surface of the RSD regions 402 and contacting the vertical sides of the sidewall spacers 302. The dielectric regions 502 may be formed utilizing a conventional deposition process including, but not limited to, depositing dielectric material using molecular beam epitaxy (MBE), CVD, PECVD, ALD, evaporation, physical vapor deposition (PVD), chemical solution deposition, and other like deposition processes. The dielectric material may be deposited on the RSD regions 402, the sidewall spacers 302, and the dummy gate hardmask 204 using a blanket deposition process and then planarized using a conventional process such as, for example, chemical mechanical planarization (CMP) so an upper surface of the dielectric regions 502 is substantially flush with an upper surface of the dummy gate hardmask 204. For this reason, it may be preferable that the dielectric regions 502 are composed of a dielectric material having a composition different than that of the dummy hardmask 204 and sidewall spacers 302.

In an embodiment, the dielectric regions 502 may be composed of a low-k dielectric material including, but not limited to, an oxide and/or silicates including metal silicates, aluminates, and titanates. A "low-k" material is a dielectric material with a lower dielectric constant relative to silicon dioxide (SiO$_2$), which is 3.9 (i.e., the ratio of the permittivity of SiO$_2$ divided by the permittivity of a vacuum). In an embodiment in which the dielectric regions 502 are composed of an oxide, the oxide may selected from the group including, but not limited to, SiO$_2$, HfO$_2$, ZrO$_2$, Al$_2$O$_3$, TiO$_2$, La$_2$O$_3$, SrTiO$_3$, LaAlO$_3$, Y$_2$O$_3$, and mixtures thereof. In another embodiment, the dielectric regions 502 may be composed of a dielectric material with a dielectric constant ranging from approximately 4.0 to approximately 7.0. In such an embodiment, the dielectric regions 502 may be composed of an oxide, including, but not limited to, silicon oxide, carbon doped silicon oxide, fluorine doped silicon oxide, hydrogen silsesquioxane polymer (HSQ), methyl silsesquioxane polymer (MSQ), polyphenylene oligomer, methyl doped silica, SiO$_x$(CH$_3$)$_y$, SiC$_x$O$_y$H$_y$, organosilicate glass (SiCOH), porous SiCOH, and mixtures thereof.

Figure 6:
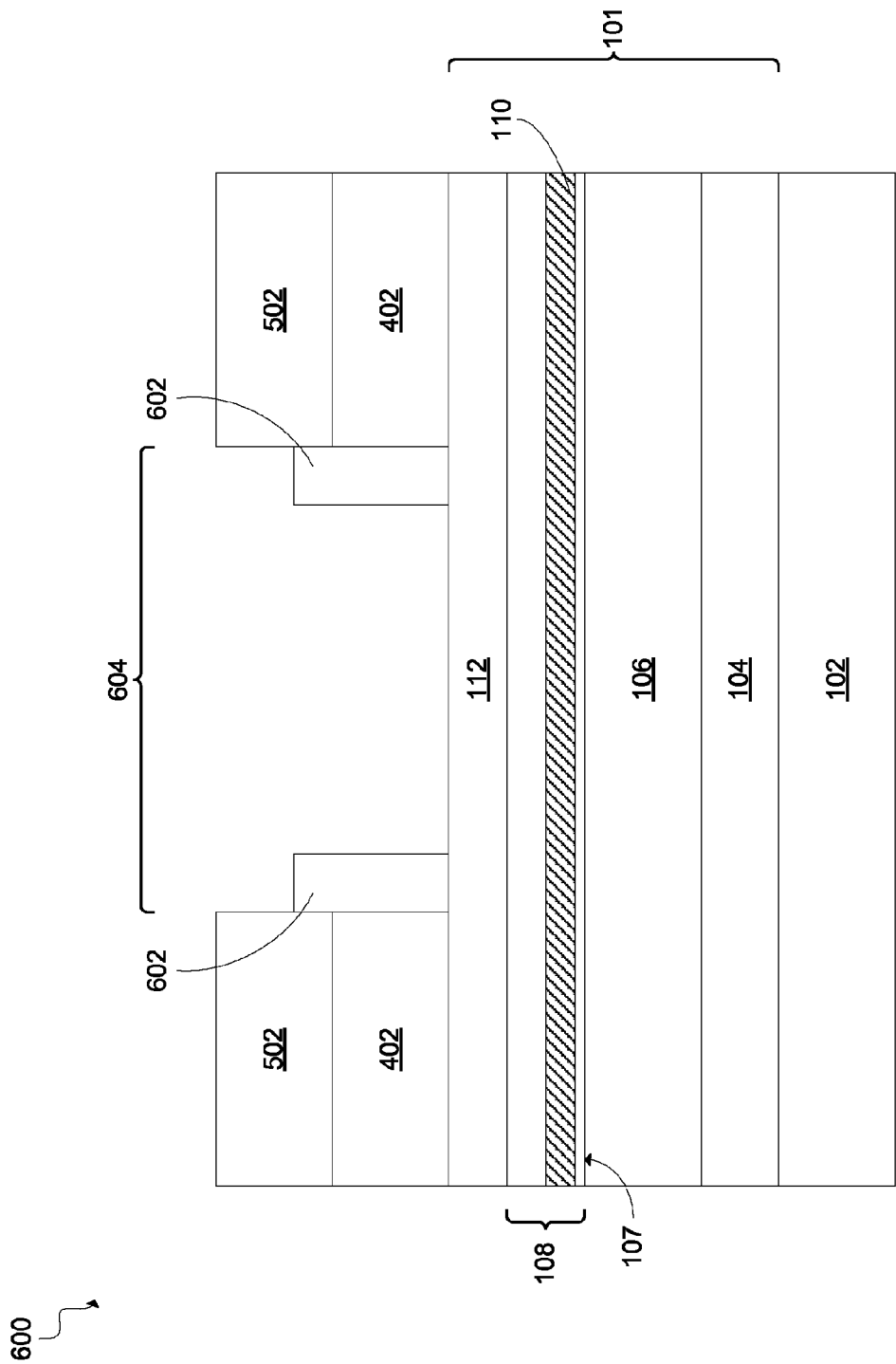
FIG. 6 is a cross sectional view illustrating the removal of the dummy hardmask and the dummy gate, according to an embodiment of the present invention.

Referring now to FIG. 6, a structure 600 is illustrative of the device after the dummy gate hardmask 204 (FIG. 5), the dummy gate 202 (FIG. 5), and a portion of the sidewall spacers 302 (FIG. 5) have been removed, leaving a pair of gate spacers 602 (hereinafter "gate spacers") and a T-shaped gate trench 604 exposed. In a preferred embodiment, the dummy gate hardmask 204 (FIG. 5), the dummy gate 202 (FIG. 5), and a portion of the sidewall spacers 302 (FIG. 5) may be removed by conventional etching processes selective to the dielectric regions 502, such as, for example, RIE. In an embodiment, the etching process used to remove the dummy gate hardmask 204 (FIG. 5), the dummy gate 202 (FIG. 5), and a portion of the sidewall spacers 302 (FIG. 5) stops before and does not affect the etch stop layer 112.

Figure 7A:
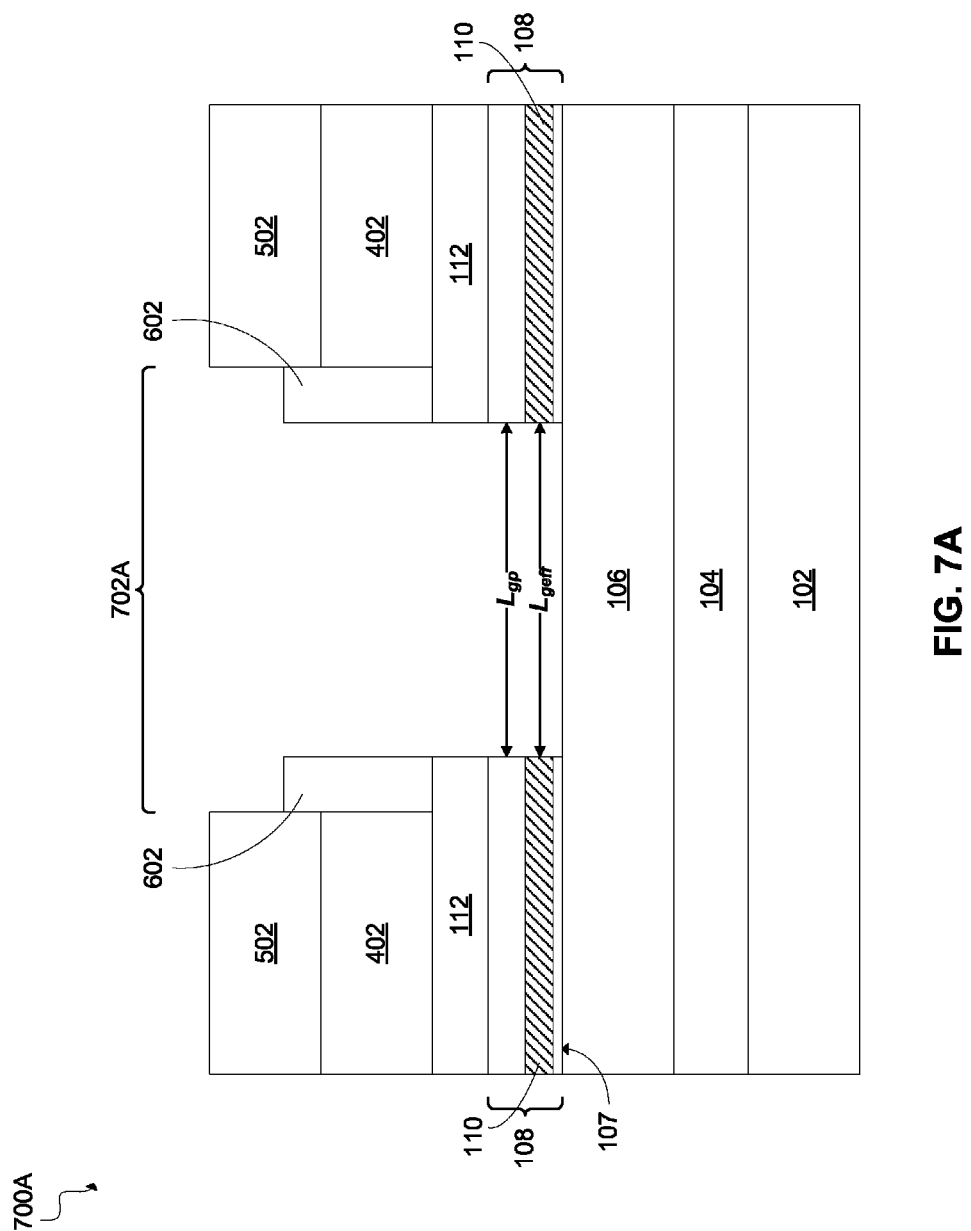
FIG. 7A is a cross sectional view illustrating the removal of an etch stop layer and a barrier layer and formation of a T-shaped gate trench, according to an embodiment of the present invention.

Referring now to FIG. 7A, the etch stop layer 112 (FIG. 6) and the entirety of the barrier layer 108, including the delta doped region 110, may be removed from the portion of the T-shaped gate trench 604 not covered by the gate spacers 602 to form a T-shaped gate region 702A structure 700A. In one embodiment, the etch stop layer 112 and the entirety of the barrier layer 108, including the delta doped region 110, in the portion of the T-shaped gate trench 604 not covered by the gate spacers 602 may be removed by a conventional etching process selective to the channel layer 106 such as, for example, RIE. The outer edges of the T-shaped gate region 702A may be self-aligned to the barrier layer 108, including the delta doped region 110, resulting in an effective gate length L$_{geff}$ that may be equal to the physical gate length L$_{gp}$. In other words, there may be available electrons present in the regions below the gate spacers 602 that border the T-shaped gate region 702A.

Figure 7B:
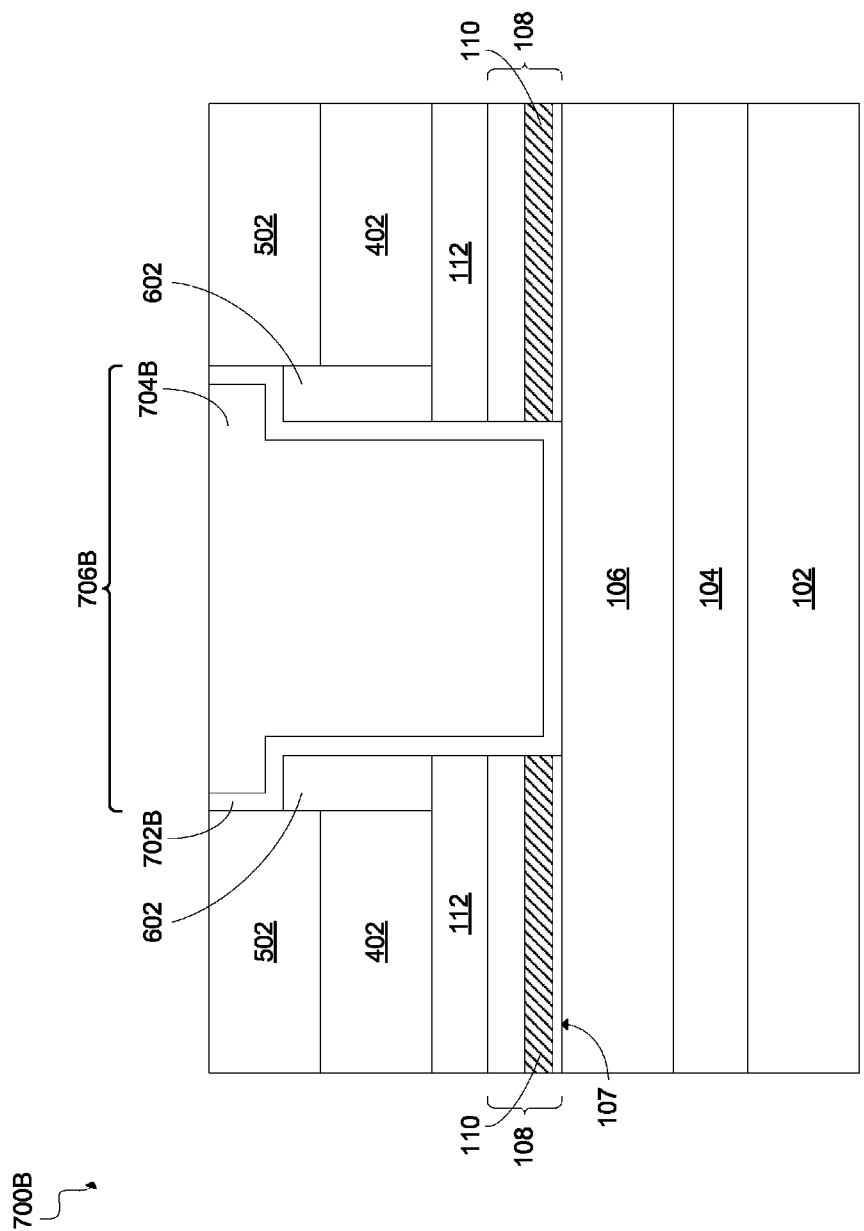
FIG. 7B is a cross sectional view illustrating the formation of a gate dielectric and a gate conductor, according to an embodiment of the present invention.

Referring now to FIG. 7B, a gate dielectric layer 702B and a gate conductor 704B may be deposited and planarized in the T-shaped gate region 702A (FIG. 7A) to form a T-shaped gate structure 706B on the III-V MOSFET structure 700B. The gate dielectric layer 702B may be composed of a dielectric material having a dielectric constant of greater than approximately 4.0; such a dielectric material is referred to hereafter as a high-k dielectric material. The gate dielectric layer 702B may be composed of a high-k dielectric material having a dielectric constant of greater than approximately 7.0. In a preferred embodiment, the gate dielectric layer 702B may be composed of a high-k dielectric material having a dielectric constant of greater than approximately 10.0. The dielectric constants mentioned herein are relative to a vacuum, unless otherwise stated. The gate dielectric layer 702B may be composed of a high-k dielectric material including, but not limited to: an oxide, nitride, oxynitride and/or silicates including metal silicates, aluminates, titanates, and nitrides. In one embodiment, the gate dielectric layer 702B may be composed of HfO$_2$, ZrO$_2$, Al$_2$O$_3$, TiO$_2$, La$_2$O$_3$, SrTiO$_3$, LaAlO$_3$, Y$_2$O$_3$, a pervoskite oxide, HfSiO$_z$, HfAlO$_z$, or HfAlO$_a$N$_b$. The gate dielectric layer 702B, may be formed utilizing a conventional deposition process including, but not limited to, MBE, CVD, PECVD, ALD, evaporation, PVD, chemical solution deposition, and other like deposition processes.

The thickness of the gate dielectric layer 702B may vary depending on the deposition technique employed in forming the same as well as the composition and number of dielectrics of the gate dielectric layer 702B. Typically, the gate dielectric layer 702B may have a thickness of approximately 0.5 nm to approximately 20 nm.

The gate conductor 704B may be composed of any conductive material such as, for example: polysilicon, polysilicon germanium, conductive metals, conductive metal alloys, conductive silicides, conductive nitrides, and combinations or multilayers thereof. When metallic-containing gate conductors are employed, the metallic gate conductor can be doped so as to shift the workfunction of the gate conductor. Illustrative examples of dopant ions include As, P, B, Sb, Bi, Al, Ga, Ti, or mixtures thereof. The same dopants may be used with the polysilicon or polySiGe mentioned above. In a preferred embodiment, the gate conductor 704B is a conductive metal such as Al, Pt, Au, W, and Ti. The gate conductor 704B may be formed by a conventional deposition process such as, for example, CVD, PECVD, PVD, plating, thermal or ebeam evaporation, and sputtering.

In one embodiment, after the gate dielectric layer 702B and the gate conductor 704B are deposited they may be planarized using a conventional process such as, for example, CMP, so that an upper surface of the T-shaped gate structure 706B is substantially flush with the upper surface of the dielectric regions 502.

Figure 8A:
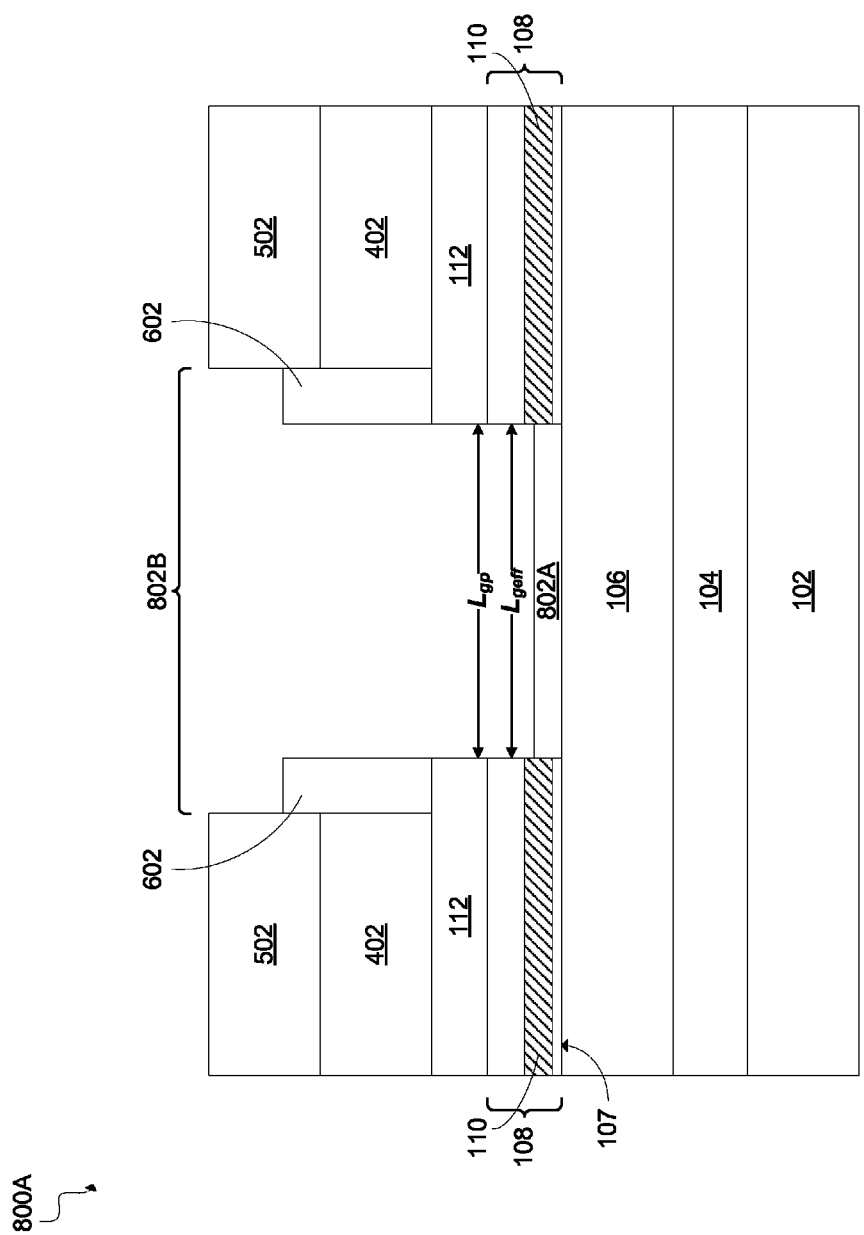
FIG. 8A is a cross sectional view of the formation of an undoped region at the bottom of the T-shaped gate trench, according to an embodiment of the present invention.

Referring now to FIG. 8A, and in another embodiment, a structure 800A shows an undoped region 802A epitaxially grown on the exposed upper surface of the channel layer 106 to form a T-shaped gate region 804A. The undoped region 802A may be composed of the same material as the barrier layer 108 and grown through an epitaxial growth process that is selective to the channel layer 106 (i.e., does not result in epitaxial growth on the dielectric regions 502, the gate spacers 602, or the barrier layer 108). The undoped region 802A may have a thickness of approximately 1 nm to approximately 2 nm. The outer edges of the T-shaped gate region 804A may be self-aligned to the barrier layer 108, including the delta doped region 110, resulting in an effective gate length $L_{geff}$ that may be equal to the physical gate length $L_{gp}$. In other words, there may be available electrons present in the regions below the gate spacers 602 that border the T-shaped gate region 804A.

Figure 8B:
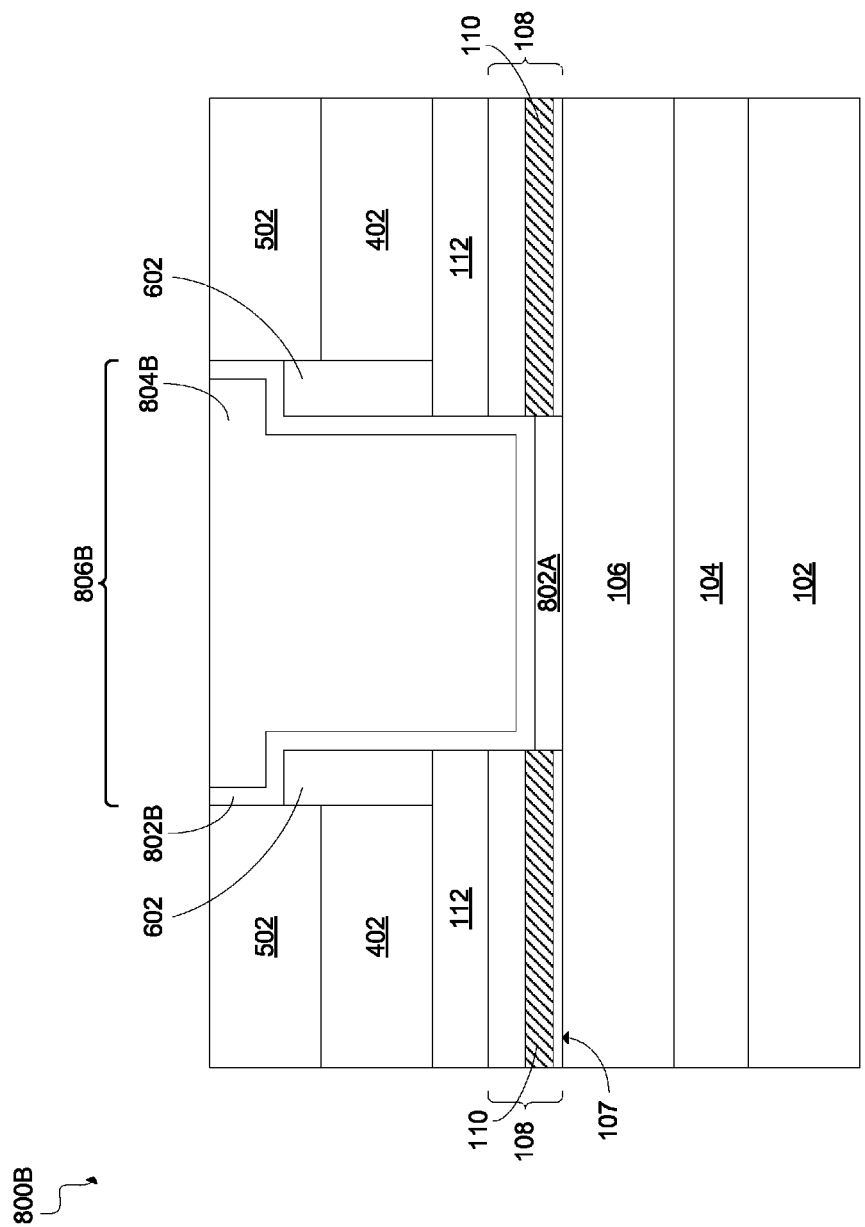
FIG. 8B is a cross sectional view of the formation of a gate dielectric and a gate conductor, according to an embodiment of the present invention.

Referring now to FIG. 8B, a III-V MOS-HEMT structure 800B may be formed by depositing a gate dielectric layer 802B and a gate conductor 804B in the T-shaped gate region 804A (FIG. 8A) and on the undoped region 802A to form a T-shaped gate structure 806B using the same processes and techniques described above with reference to FIG. 7B. The gate dielectric layer 802B and gate conductor 804B may be substantially similar to the gate dielectric layer 702B and the gate conductor 704B as described above with reference to FIG. 7B.

As described above, preferred embodiments of the present invention provide for self-aligned overlapped III-V MOS-HEMTs and III-V MOSFETs using formation methods that avoid the problems associated with ion implantation in III-V devices such as strain relaxation and insufficient diffusion or activation of implanted ions.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor device, comprising the steps of:
    forming a III-V compound semiconductor-containing heterostructure above a substrate, wherein the III-V compound semiconductor-containing heterostructure comprises a buffer layer above the substrate, a channel layer above and in contact with the buffer layer, a barrier layer above and in contact with the channel layer, and an etch stop layer above and in contact with the barrier layer;
    forming gate spacers on an uppermost surface of the etch stop layer;
    forming raised source-drain (RSD) regions on the uppermost surface of the etch stop layer, wherein the RSD regions are adjacent to and contacting the gate spacers;
    forming a dielectric layer on the uppermost surface of the RSD regions, wherein the dielectric layer is adjacent to and contacting the gate spacers, and wherein an uppermost surface of the dielectric layer is higher than an uppermost surface of the gate spacers;
    removing a portion of the etch stop layer and a portion of the barrier layer between the gate spacers to form an opening, wherein the opening exposes an uppermost surface of the channel layer; and
    forming a T-shaped gate structure above the uppermost surface of the channel layer in the opening, wherein the T-shaped gate structure comprises:
        a narrow bottom portion extending from the uppermost surface of the spacers to no further than a lowermost portion of the barrier layer, the narrow bottom portion having sidewalls that are substantially flush with sidewalls of the gate spacers, and
        a wide upper portion that extends from the uppermost surface of the spacers to the uppermost surface of the dielectric layer, the wide upper portion having a lowermost surface only in contact with the uppermost surface of the gate spacers.

2. The method of claim 1, further comprising forming a delta-doped region within the barrier layer by doping the region with an element from Group IV, II, or VI of the Periodic Table of Elements.

3. The method of claim 1, wherein the upper portion of the T-shaped gate structure is laterally wider, by the combined width of the gate spacers, than the bottom portion of the T-shaped gate structure.

4. The method of claim 1, further comprising forming an undoped region between the bottom portion of the T-shaped gate structure and the channel layer.

5. A method of forming a semiconductor device, comprising the steps of:
    forming a III-V compound semiconductor-containing heterostructure on a substrate, wherein the III-V compound semiconductor-containing heterostructure comprises a buffer layer above the substrate, a channel layer above and in contact with the buffer layer, a barrier layer above and in contact with the channel layer, and an etch stop layer above and in contact with the barrier layer;

forming a dummy gate on an uppermost surface of the etch stop layer;

forming a dummy gate hardmask on an uppermost surface of the dummy gate;

forming spacers on the uppermost surface of the etch stop layer, the spacers adjacent to and contacting the dummy gate and the dummy gate hardmask, wherein the spacers have an uppermost surface that is substantially flush with an upper surface of the dummy gate hardmask;

forming raised source-drain (RSD) regions on the uppermost surface of the etch stop layer, the RSD regions adjacent to and contacting the spacers;

forming a dielectric layer on an uppermost surface of the RSD regions, the dielectric layer adjacent to and contacting the spacers, wherein an uppermost surface of the dielectric layer is substantially flush with the uppermost surface of the spacers;

removing the dummy gate hardmask;

removing the dummy gate;

removing an upper portion of the spacers to form gate spacers, wherein an uppermost surface of the gate spacers is lower than the uppermost surface of the dielectric layer;

removing a portion of the etch stop layer and the barrier layer between the spacers to form an opening, wherein the opening exposes an upper surface of a channel layer; and forming a T-shaped gate structure above the uppermost surface of the channel layer in the opening, wherein the T-shaped gate structure comprises:

a narrow bottom portion extending from the uppermost surface of the spacers to no further than a lowermost surface of the barrier layer, the narrow bottom portion having sidewalls that are substantially flush with sidewalls of the gate spacers, and a wide upper portion that extends from the uppermost surface of the spacers to the uppermost surface of the dielectric layer, the wide upper portion having a lowermost surface only in contact with the narrow bottom portion and the uppermost surface of the gate spacers.

6. The method of claim 5, further comprising forming a delta-doped region above a bottom surface of the barrier layer by doping the region with an element from Group IV, II, or VI of the Periodic Table of Elements.

7. The method of claim 5, wherein the upper portion of the T-shaped gate structure is laterally wider, by the combined width of the gate spacers, than the bottom portion of the T-shaped gate structure.

8. The method of claim 5, wherein the forming the T-shaped gate structure in the opening comprises forming a gate dielectric layer and a gate conductor thereon.

9. The method of claim 5, further comprising forming an undoped region between the bottom portion of the T-shaped gate structure and the channel layer.

* * * * *